(12) United States Patent
Lin et al.

(10) Patent No.: US 9,324,582 B2
(45) Date of Patent: Apr. 26, 2016

(54) SEMICONDUCTOR PACKAGE AND FABRICATION METHOD THEREOF

(71) Applicant: Siliconware Precision Industries Co., Ltd., Taichung (TW)

(72) Inventors: Chun-Tang Lin, Taichung Hsien (TW); Yi-Che Lai, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 84 days.

(21) Appl. No.: 13/922,798

(22) Filed: Jun. 20, 2013

(65) Prior Publication Data

US 2014/0264928 A1     Sep. 18, 2014

(30) Foreign Application Priority Data

Mar. 12, 2013   (TW) ............... 102108595 A

(51) Int. Cl.
| | | |
|---|---|---|
| H01L 23/48 | (2006.01) | |
| H01L 21/52 | (2006.01) | |
| H01L 21/56 | (2006.01) | |
| H01L 21/48 | (2006.01) | |
| H01L 25/065 | (2006.01) | |
| H01L 23/498 | (2006.01) | |
| H01L 23/31 | (2006.01) | |

(52) U.S. Cl.
CPC .............. *H01L 21/52* (2013.01); *H01L 21/486* (2013.01); *H01L 21/563* (2013.01); *H01L 23/3114* (2013.01); *H01L 23/3128* (2013.01); *H01L 23/49827* (2013.01); *H01L 23/49833* (2013.01); *H01L 25/065* (2013.01); *H01L 23/3135* (2013.01); *H01L 23/481* (2013.01); *H01L 2224/16225* (2013.01); *H01L 2224/32225* (2013.01); *H01L 2224/73204* (2013.01); *H01L 2924/15174* (2013.01); *H01L 2924/15311* (2013.01)

(58) Field of Classification Search
CPC ...................... H01L 23/3135; H01L 23/481
See application file for complete search history.

(56) References Cited

U.S. PATENT DOCUMENTS

| | | | |
|---|---|---|---|
| 2011/0058348 A1* | 3/2011 | Sakai et al. ............ | 361/803 |
| 2012/0193779 A1* | 8/2012 | Lee ............ | H01L 23/3135 |
| | | | 257/737 |

* cited by examiner

*Primary Examiner* — William Harriston
(74) *Attorney, Agent, or Firm* — Mintz Levin Cohn Ferris Glovsky and Popeo, P.C.; Peter F. Corless; Steven M. Jensen

(57) ABSTRACT

A fabrication method of a semiconductor package is disclosed, which includes the steps of: disposing a plurality of first semiconductor elements on an interposer; forming a first encapsulant on the interposer for encapsulating the first semiconductor elements; disposing a plurality of second semiconductor elements on the first semiconductor elements; forming a second encapsulant on the first semiconductor elements and the first encapsulant for encapsulating the second semiconductor elements; and thinning the interposer, thereby reducing the overall stack thickness and preventing warpage of the interposer.

11 Claims, 7 Drawing Sheets

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 102108595, filed Mar. 12, 2013, the entire contents of which is incorporated herein by reference.

BACKGROUND OF THE INVENTION

1. Field of the Invention

The present invention relates to semiconductor packages, and more particularly, to a semiconductor package having an interposer and a fabrication method thereof.

2. Description of Related Art

Along with the rapid development of electronic industries, electronic products are becoming lighter, thinner, shorter and smaller. To meet the demands for high integration and miniaturization of electronic products, various types of packages such as chip scale packages (CSPs), direct chip attached (DCA) packages and multi-chip module (MCM) packages have been developed by using flip-chip technologies so as to increase circuit densities, reduce chip packaging sizes and shorten signal transmission paths.

However, in a flip-chip packaging process, conductive bumps of a semiconductor chip crack easily under thermal stresses caused by a big CTE (Coefficient of Thermal Expansion) mismatch between the semiconductor chip and the corresponding packaging substrate, thereby adversely affecting the formation of joints between the conductive bumps of the semiconductor chip and the correspondingly packaging substrate and easily resulting in delamination of solder bumps from the packaging substrate.

Further, along with increased integration of integrated circuits, CTE mismatches between chips and packaging substrates induce more thermal stresses and lead to more serious warpages, thereby reducing the product reliability and resulting in failure of reliability tests.

Conventionally, a plurality of chips are disposed on a packaging substrate in a 2D manner. Accordingly, when the number of the chips increases, the area of the packaging substrate must be increased, which, however, does not meet the demands for miniaturization and high performance of electronic products.

Further, as the circuit density of semiconductor chips continuously increases, the pitch between electrode pads of the semiconductor chips reaches the nanometer scale. On the other hand, the pitch between contacts of packaging substrates are only at the micrometer scale and cannot effectively match the pitch between the electrode pads of the semiconductor chips, thus adversely affecting the fabrication of electronic products.

To overcome the above-described drawbacks, an interposer made of a semiconductor material is provided and a 3D stacking technique is used for connecting a semiconductor chip to a packaging substrate.

FIG. 1 is a schematic cross-sectional view of a conventional semiconductor package 1. Referring to FIG. 1, a silicon interposer 11 is sandwiched between a packaging substrate 10 and a semiconductor chip 14. To form the silicon interposer 11, a plurality of through silicon vias (TSVs) 110 are formed to penetrate a silicon wafer, an RDL (redistribution layer) structure 111 is formed through a semiconductor process on one side of the silicon wafer and a plurality of conductive bumps 12a are formed on the other side of the silicon wafer. Then, the silicon wafer is cut into a plurality of silicon interposers 11. Each of the silicon interposers 11 is disposed on an upper side of a packaging substrate 10 via the conductive bumps 12a and an underfill 12b is filled between the silicon interposer 11 and the packaging substrate 10 for encapsulating the conductive bumps 12a. Thereafter, at least a semiconductor chip 14 is disposed on the silicon interposer 11 and electrically connected to the RDL structure 111 through a plurality of conductive bumps 14a. The RDL structure 111 allows the silicon interposer 11 to receive more than one semiconductor chip 14 without the need to increase the area of the silicon interposer 11. Then, an underfill 14b is filled between the silicon interposer 11 and the semiconductor chip 14 for encapsulating the conductive bumps 14a. Thereafter, a plurality of solder balls 15 are formed on a lower side of the packaging substrate 10 for connecting the semiconductor package to a circuit board.

Through the silicon interposer 11, the semiconductor chip 14 having a high circuit density is connected to the packaging substrate 10.

Since the silicon interposer 11 has a CTE equal or close to that of the semiconductor chip 14, cracking of the conductive bumps 14a between the semiconductor chip 14 and the silicon interposer 11 is prevented, thereby effectively improving the product reliability.

Compared with a conventional flip-chip package, the semiconductor package 1 has reduced length and width. For example, the packaging substrate of the conventional flip-chip package has a minimum line width of 12 um and a minimum line pitch of 12 um. When the number of the electrode pads of the semiconductor chip of the conventional flip-chip package increases, since the line width/line pitch of the packaging substrate can not be reduced, the area of the packaging substrate must be increased to accommodate more circuits for electrically connecting the semiconductor chip and the packaging substrate. On the other hand, through a semiconductor process, the silicon interposer 11 of the semiconductor package 1 has a line width below 3 um and a line pitch blow 3 um. Therefore, the silicon interposer 2 can be electrically connected to the semiconductor chip 14 having a high I/O number without the need to increase the area of the packaging substrate 10. As such, the semiconductor chip 14 is electrically connected to the packaging substrate 10 through the silicon interposer 11.

In addition, the fine-line/fine-pitch characteristic of the silicon interposer 2 leads to short electrical transmission distance and high electrical transmission speed of the semiconductor chip 14.

However, conventionally, both the semiconductor chip 14 and the silicon interposer 11 are thinned before the semiconductor chip 14 is disposed on and electrically connected to the silicon interposer 11. Therefore, warpage easily occurs to the silicon interposer 11 and consequently it is difficult to dispose and electrically connect the semiconductor chip 14 to the silicon interposer 11. To overcome the drawbacks, the silicon interposer 11 is required to have a certain thickness, which, however, hinders the miniaturization of the semiconductor package 1.

Further, although a plurality of semiconductor chips 14 can be disposed on the silicon interposer 11 in a 2D manner to improve the product functionality, it cannot meet the multi-function requirement of electronic products.

Furthermore, to dispose a plurality of semiconductor chips 14 on the silicon interposer 11, the semiconductor chips 14 are conventionally ground first and then disposed on the silicon interposer 11 one by one, thereby greatly increasing the fabrication time and cost. In addition, the semiconductor chips 14 may be thinned to different degrees and hence cannot provide an even surface for stacking and disposing of other chips.

Therefore, how to overcome the above-described drawbacks has become urgent.

SUMMARY OF THE INVENTION

In view of the above-described drawbacks, the present invention provides a semiconductor package, which comprises: an interposer having opposite first and second sides and a plurality of first conductive through holes penetrating the first and second sides; at least a first semiconductor element having a first surface and a second surface opposite to the first surface, wherein the first semiconductor element is disposed on the first side of the interposer via the second surface thereof and electrically connected to the interposer; a first encapsulant formed on the first side of the interposer for encapsulating the first semiconductor element, wherein the first surface of the first semiconductor element is exposed from the first encapsulant; at least a second semiconductor element having a third surface and a fourth surface opposite to the third surface, wherein the second semiconductor element is disposed on the first surface of the first semiconductor element via the fourth surface thereof and electrically connected to the first semiconductor element; and a second encapsulant formed on the first surface of the first semiconductor element and the first encapsulant for encapsulating the second semiconductor element.

The above-described semiconductor package can further comprise a plurality of second conductive through holes formed in the first semiconductor element and electrically connected to the first conductive through holes.

The present invention further provides a fabrication method of a semiconductor package, which comprises the steps of: providing an interposer having opposite first and second sides and a plurality of first conductive through holes that penetrate the first side but do not penetrate the second side; disposing at least a first semiconductor element on the first side of the interposer, wherein the first semiconductor element has opposite first and second surfaces and the first semiconductor element is disposed on the first side of the interposer via the second surface thereof; forming a first encapsulant on the first side of the interposer for encapsulating the first semiconductor element, wherein the first surface of the first semiconductor element is exposed from the first encapsulant; forming a plurality of second conductive through holes in the first semiconductor element and electrically connecting the second conductive through holes and the interposer; disposing at least a second semiconductor element on the first surface of the first semiconductor element and electrically connecting the second semiconductor element and the first semiconductor element, wherein the second semiconductor element has opposite third and fourth surfaces and the second semiconductor element is disposed on the first surface of the first semiconductor element via the fourth surface thereof; forming a second encapsulant on the first surface of the first semiconductor element and the first encapsulant for encapsulating the second semiconductor element; and partially removing the interposer from the second side thereof so as to expose the first conductive through holes.

The present invention provides another fabrication method of a semiconductor package, which comprises the steps of: providing an interposer having opposite first and second sides and a plurality of first conductive through holes that penetrate the first side but do not penetrate the second side; disposing at least a first semiconductor element on the first side of the interposer, wherein the first semiconductor element has opposite first and second surfaces and a plurality of second conductive through holes, the first semiconductor element is disposed on the first side of the interposer via the second surface thereof and the second conductive through holes are electrically connected to the interposer; forming a first encapsulant on the first side of the interposer for encapsulating the first semiconductor element, wherein the first surface of the first semiconductor element is exposed from the first encapsulant; disposing at least a second semiconductor element on the first surface of the first semiconductor element and electrically connecting the second semiconductor element and the first semiconductor element, wherein the second semiconductor element has opposite third and fourth surfaces and the second semiconductor element is disposed on the first surface of the first semiconductor element via the fourth surface thereof; forming a second encapsulant on the first surface of the first semiconductor element and the first encapsulant for encapsulating the second semiconductor element; and partially removing the interposer from the second side thereof so as to expose the first conductive through holes.

In the above-described methods, after the first encapsulant is formed, the first encapsulant can be partially removed to expose the first surface of the first semiconductor element.

After partially removing the interposer from the second side thereof, the above-described methods can further comprise performing a singulation process.

In the above-described semiconductor package and fabrication methods thereof, the interposer can be a silicon-containing substrate.

In the above-described semiconductor package and fabrication methods thereof, an RDL (Redistribution Layer) structure can be formed on the first side of the interposer for electrically connecting the first semiconductor element and the first conductive through holes.

In the above-described semiconductor package and fabrication methods thereof, the first semiconductor element can be a functional chip.

Further, an RDL structure can be formed on the first surface of the first semiconductor element and electrically connected to the second semiconductor element.

In the above-described semiconductor package and fabrication methods thereof, the first surface of the first semiconductor element can be flush with the first encapsulant.

In the above-described semiconductor package and fabrication methods thereof, the third surface of the second semiconductor element can be exposed from the second encapsulant by partially removing the second encapsulant. In another embodiment, the third surface of the second semiconductor element can be flush with the second encapsulant.

In the above-described semiconductor package and fabrication methods thereof, at least a circuit layer is formed on the second side of the interposer and electrically connected to the first conductive through holes.

In the above-described semiconductor package and fabrication methods thereof, a packaging substrate can be disposed on the second side of the interposer and electrically connected to the interposer.

Therefore, by stacking multi-layers of semiconductor elements on an interposer first and then thinning the interposer, the present invention reduces the overall stack thickness of the semiconductor package without causing warpage of the interposer and allows a plurality of heterogeneous or homogeneous chips to be integrated in a semiconductor package. Therefore, the present invention effectively reduces the fabrication cost and increases the productivity.

Furthermore, the present invention meets the multi-function requirement of electronic products by stacking multi-layers of semiconductor elements.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "lower", "first", "second", "a" etc. are merely for illustrative purposes and should not be construed to limit the scope of the present invention.

FIGS. 2A to 2K are schematic cross-sectional views showing a fabrication method of a semiconductor package 2, 2' according to a first embodiment of the present invention.

Figure 1:
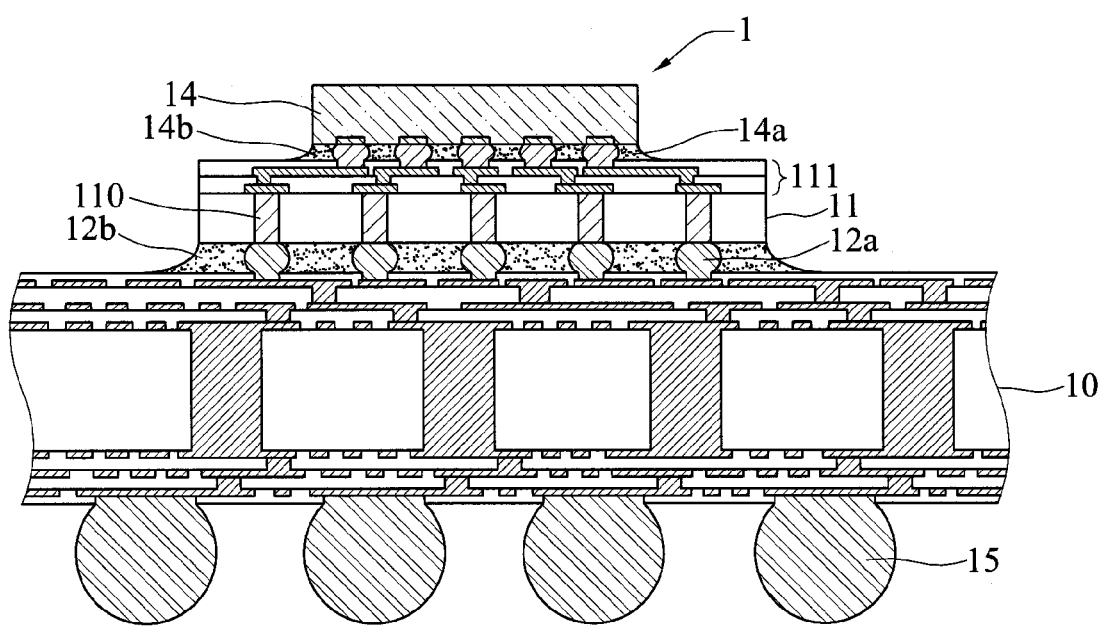
FIG. 1 is a schematic cross-sectional view of a conventional semiconductor package.
Figure 2A:
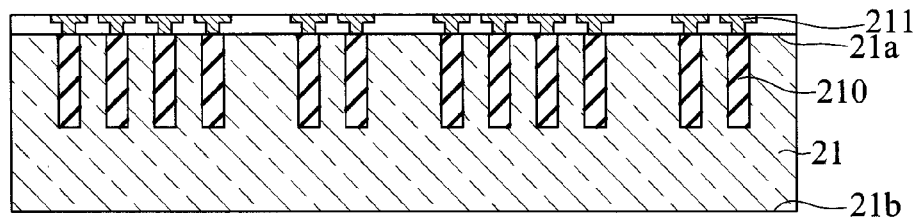
FIG. 2A to 2K are schematic cross-sectional views showing a fabrication method of a semiconductor package according to a first embodiment of the present invention.

Referring to FIG. 2A, an interposer 21 is provided, which has opposite first and second sides 21a, 21b and a plurality of first conductive through holes 210 that penetrate the first side 21a but do not penetrate the second side 21b.

In the present embodiment, the interposer 21 is a silicon-containing substrate such as a semiconductor chip, a wafer or glass. The first conductive through holes 210 are made of copper.

A first RDL structure 211 is formed on the first side 21a of the interposer 21 and electrically connected to the first conductive through holes 210.

Figure 2B:
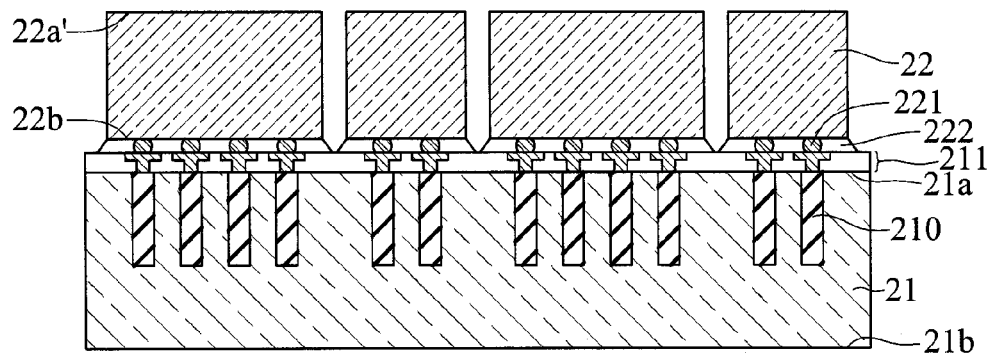

Referring to FIG. 2B, a plurality of first semiconductor elements 22 are disposed on the first side 21a of the interposer 21 and electrically connected to the interposer 21 in a flip-chip manner. In particular, the first semiconductor elements 22 are disposed on and electrically connected to the first RDL structure 211 through a plurality of conductive bumps 221 and further electrically connected to the first conductive through holes 210 through the first RDL structure 211. An underfill 222 is formed between the first semiconductor elements 22 and the first side 21a of the interposer 21 for encapsulating the conductive bumps 221.

In the present embodiment, the first semiconductor elements 22 are functional chips. The first semiconductor elements 22 can have the same or different functions. The conductive bumps 221 are such as solder balls or copper bumps or a combination thereof.

Each of the first semiconductor elements 22 has a first surface 22a' and a second surface 22b opposite to the first surface 22a' and is disposed on the first side 21a of the interposer 21 via the second surface 22b thereof.

According to the present method, since the interposer 21 is not thinned, when the first semiconductor elements 22 are stacked on the interposer 21, the interposer 21 does not warp.

Figure 2C:
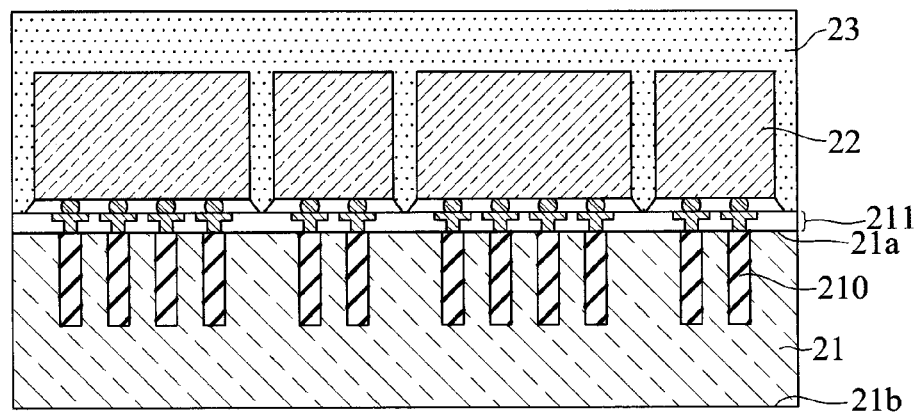

Referring to FIG. 2C, a molding process is performed to form a first encapsulant 23 on the first side 21a of the interposer 21 for encapsulating the first semiconductor elements 22 and the underfill 222.

In the present embodiment, the first encapsulant 23 is made of a heat dissipating material. In other embodiments, the first encapsulant 23 can be made of a glass material, an underfill material or an insulating material.

Figure 2D:
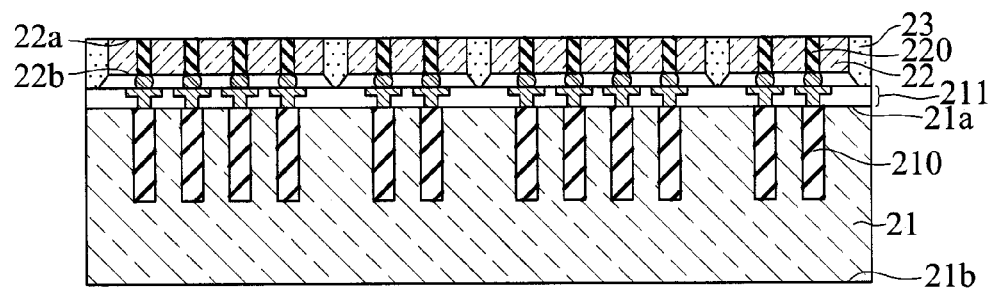

Referring to FIG. 2D, the first encapsulant 23 is partially removed to expose the first surfaces of the first semiconductor elements 22. In the present embodiment, the first semiconductor elements 22 are also partially removed from the first surfaces 22a' thereof such that the first semiconductor elements 22 have first surfaces 22a exposed from the first encapsulant 23. Then, a plurality of second conductive through holes 220 are formed in the first semiconductor elements 22 and electrically connected to the first conductive through holes 210 through the first RDL structure 211. As such, the first semiconductor elements 22 serve as another interposer.

In the present embodiment, the first encapsulant 23 is partially removed by grinding, cutting or etching.

Further, the first surfaces 22a of the first semiconductor elements 22 are flush with the first encapsulant 23 so as to form an even surface. By partially removing the first semiconductor elements 22 from the first surfaces 22a' thereof, the first semiconductor elements 22 are thinned.

The second conductive through holes 220 are made of copper and formed by laser drilling and electroplating.

In the present invention, the second conductive through holes 220 of the first semiconductor elements 22 can be in direct electrical connection with the first conductive through holes 210 instead of through the first RDL structure 211, thereby shortening the electrical signal transmission distance.

Figure 2E:
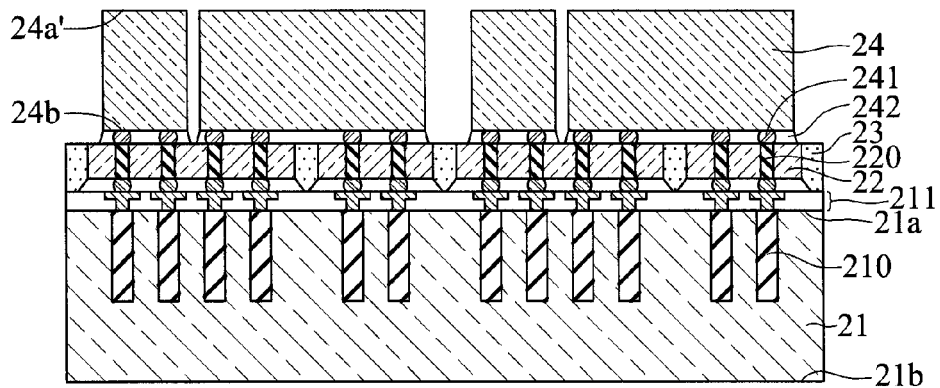

Referring to FIG. 2E, a plurality of second conductive elements 24 are disposed on the first surfaces 22a of the first semiconductor elements 22 and electrically connected to the second conductive through holes 220 of the first semiconductor elements 22 through a plurality of conductive bumps 241. An underfill 242 is formed between the first semiconductor elements 22 and the second semiconductor elements 24 for encapsulating the conductive bumps 241. The conductive bumps 241 can be solder balls, copper bumps or a combination thereof.

In the present embodiment, the second semiconductor elements 24 can be the same or different chips. The second semiconductor elements 24 can be the same as or different from the first semiconductor elements 22.

The second semiconductor elements 24 are disposed and electrically connected to the first semiconductor elements 22 in a flip-chip manner. In another embodiment, the second semiconductor elements 24 can be electrically connected to the first semiconductor elements 22 through wire bonding.

Further, if needed, a single second semiconductor element 24 can be disposed across two first semiconductor elements 22, as shown in FIG. 2E, and have conductive through holes formed therein.

Each of the second semiconductor elements 24 has a third surface 24a' and a fourth surface 24b opposite to the third surface 24a' and the second semiconductor elements 24 are disposed on the first surfaces 22a of the first semiconductor elements 22 via the fourth surfaces 24b thereof.

According to the present invention, the first semiconductor elements 22 can be ground at the same time so as to reduce the fabrication time and cost. Further, the first semiconductor elements 22 can be thinned to the same degree to provide an even surface so as for the second semiconductor elements 24 to be disposed on and across the first semiconductor elements 22.

Figure 2F:
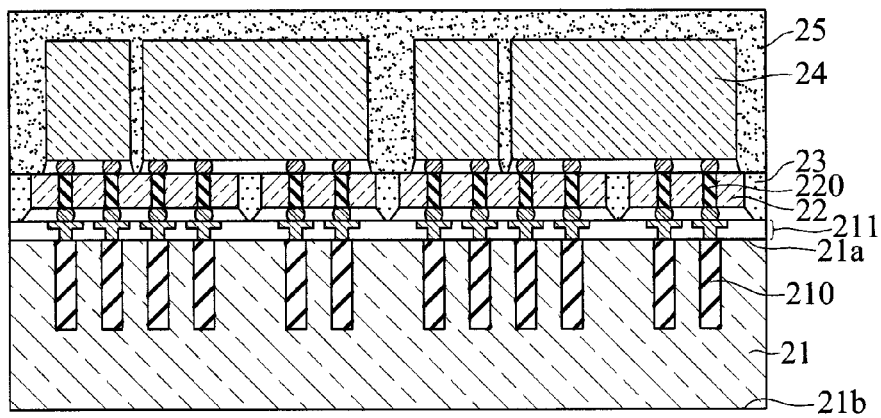

Referring to FIG. 2F, a molding process is performed to form a second encapsulant 25 on the first surfaces 22a of the first semiconductor elements 22 and the first encapsulant 23 for encapsulating the second semiconductor elements 24 and the underfill 242.

Figure 2G:
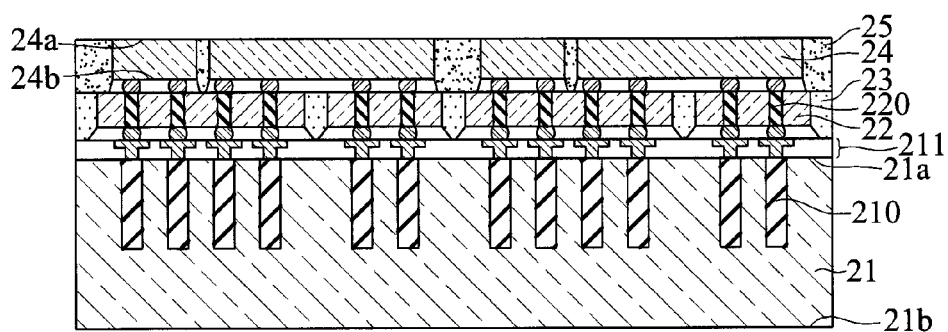

Referring to FIG. 2G, the second encapsulant 25 and the second semiconductor elements 24 are partially removed to expose third surfaces 24a of the second semiconductor elements 24 from the second encapsulant 25.

In the present embodiment, the second encapsulant 25 is partially removed by grinding, cutting or etching.

The third surfaces 24a of the second semiconductor elements 24 are flush with the second encapsulant 25 so as to form an even surface. By partially removing the second semiconductor elements 24 from the third surfaces 24a' thereof, the second semiconductor elements 24 are thinned.

On the other hand, if the second semiconductor elements 24 are disposed on and electrically connected to the first semiconductor elements 22 by wire bonding, since the overall thickness of the second semiconductor elements 24 already meets the thinning requirement, the flattening and thinning process can be dispensed with. As such, bonding wires can be prevented from being damaged by the flattening and thinning process.

Further, the processes of FIGS. 2E to 2G can be repeated to stack multi-layers of chips on the second semiconductor elements 24 and the second encapsulant 25. It should be noted that the flattening and thinning process can be dispensed with if there is no further stacking process.

Figure 2H:
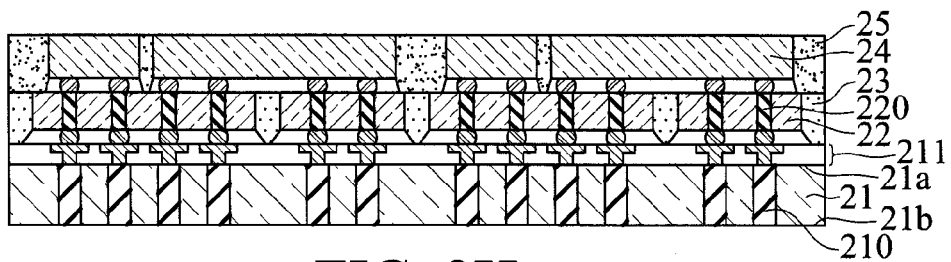

Referring to FIG. 2H, the second side 21b of the interposer 21 is partially removed to expose the ends of the first conductive through holes 210. As such, the first conductive through holes 210 penetrate the first and second sides 21a, 21b of the interposer 21.

Figure 2I:
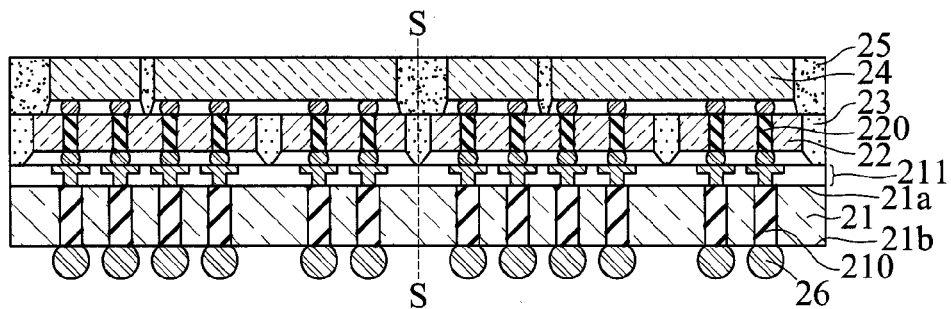

Referring to FIG. 2I, a plurality of conductive elements 26 such as solder balls are formed on the exposed ends of the first conductive through holes 210.

Figure 2J:
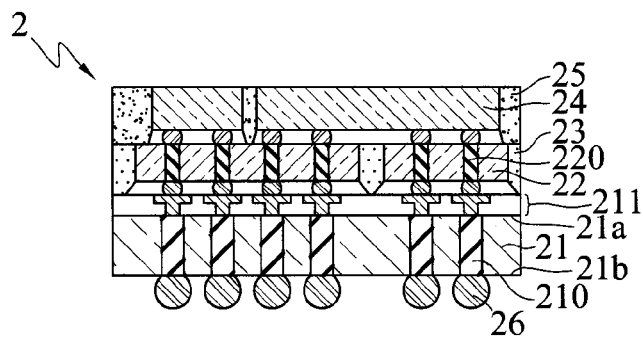

Referring to FIG. 2J, a singulation process is performed along a cutting path S of FIG. 2I to form a semiconductor package 2. In the semiconductor package 2, the first and second encapsulants 23, 25 are flush with the interposer 21 at sides.

Figure 2K:
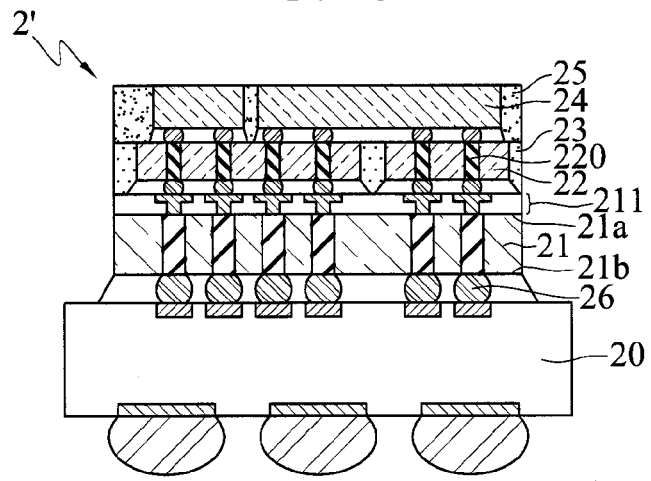

Referring to FIG. 2K, a packaging substrate 20 is disposed on the conductive elements 26 on the second side 21b of the interposer 21 and electrically connected to the first conductive through holes 210 through the conductive elements 26.

FIGS. 3A to 3K are schematic cross-sectional views showing a fabrication method of a semiconductor package 3, 3' according to a second embodiment of the present invention. A main difference of the present embodiment from the first embodiment is the fabrication of the second conductive through holes of the first semiconductor elements.

Figure 3A:
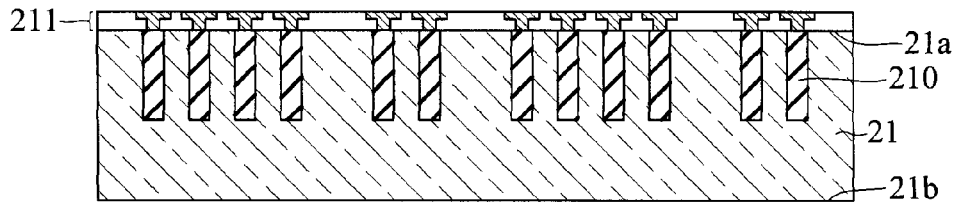
FIGS. 3A to 3K are schematic cross-sectional views showing a fabrication method of a semiconductor package according to a second embodiment of the present invention.

Referring to FIG. 3A, an interposer 21 as in FIG. 2A is provided.

Figure 3B:
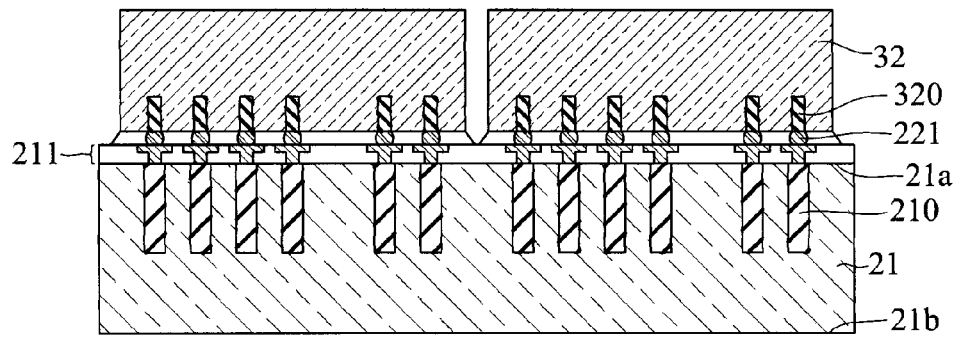

Referring to FIG. 3B, a plurality of first semiconductor elements 32 are disposed on the first side 21a of the interposer 21 and have a plurality of second conductive through holes 320 electrically connected to the first conductive through holes 210 of the interposer 21 through a plurality of conductive bumps 221. The first semiconductor elements 32 serve as another interposer.

Figure 3C:
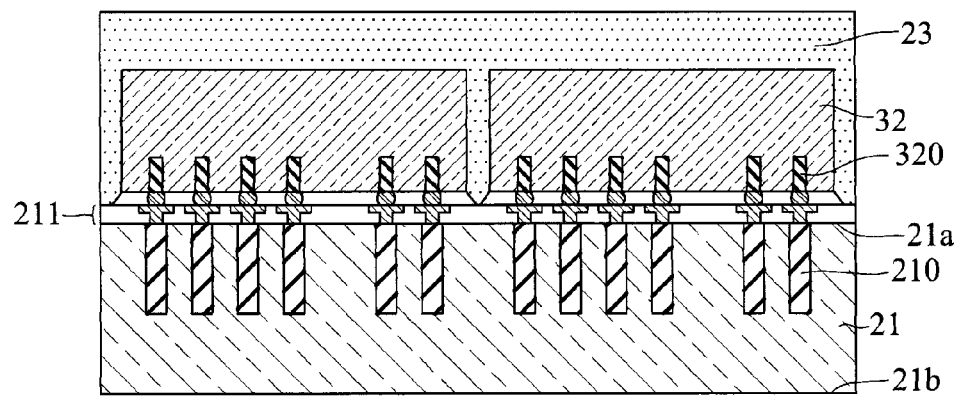

Referring to FIG. 3C, a first encapsulant 23 is formed on the first side 21a of the interposer 21 for encapsulating the first semiconductor elements 32.

Figure 3D:
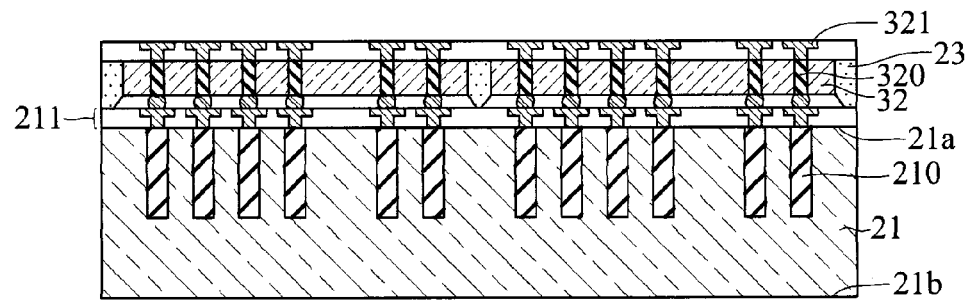

Referring to FIG. 3D, the first encapsulant 23 is partially removed to expose the first semiconductor elements 32 and the ends of the second conductive through holes 320. Then, a second RDL structure 321 is formed on the first semiconductor elements 32 and the first encapsulant 23 and electrically connected to the second conductive through holes 320.

In the present embodiment, the exposed surfaces of the first semiconductor elements 32 are flush with the first encapsulant 23 and the first semiconductor elements 32 are thinned.

In another embodiment, the second conductive through holes 320 can protrude above the first semiconductor elements 32 to serve as conductive bumps for electrically connecting the first semiconductor elements 32 to the second RDL structure 321 or second semiconductor elements 34 to be provided subsequently.

Figure 3E:
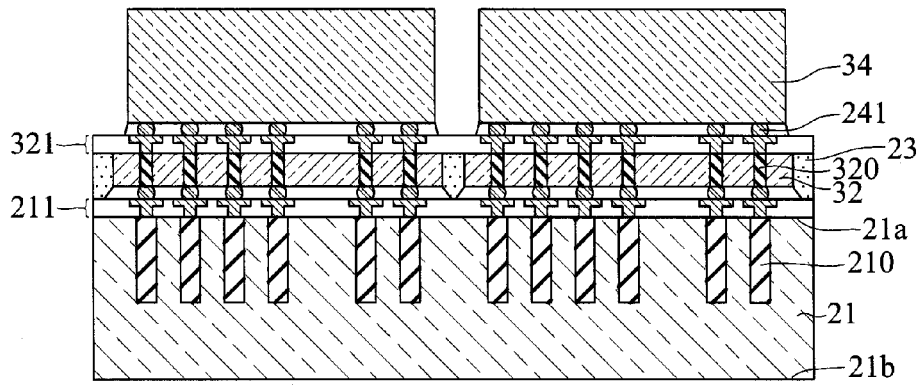

Referring to FIG. 3E, a plurality of second semiconductor elements 34 are disposed on the second RDL structure 321 and electrically connected to the second RDL structure 321 and the second conductive through holes 320 through a plurality of conductive bumps 241.

In the present embodiment, a single second semiconductor elements 34 is disposed on a single first semiconductor element 32 instead across two first semiconductor elements 32 as in the first embodiment.

In another embodiment, the second semiconductor elements 34 can be electrically connected to the second conductive through holes 320 or the second RDL structure 321 through wire bonding.

Figure 3F:
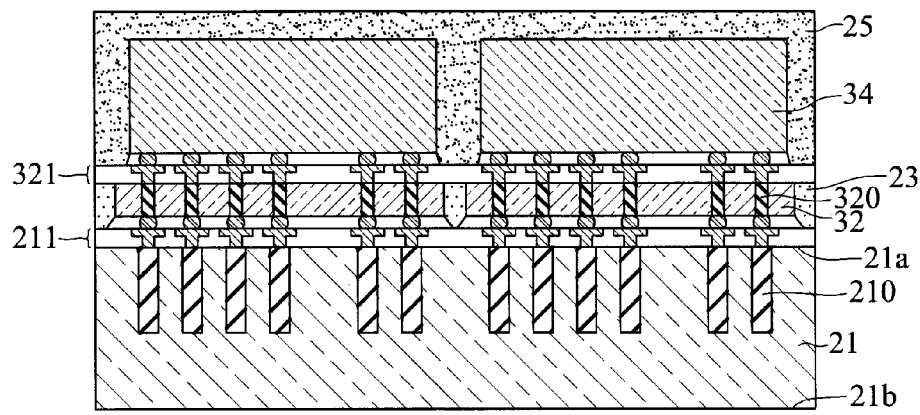

Referring to FIG. 3F, a second encapsulant 25 is formed on the second RDL structure 321 for encapsulating the second semiconductor elements 34.

Figure 3G:
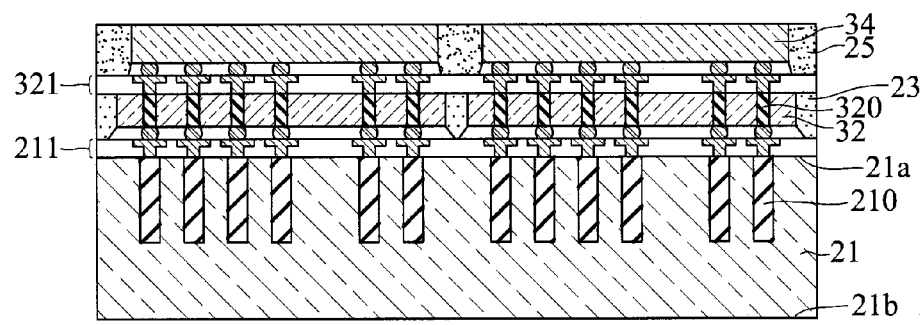

Referring to FIG. 3G, the second encapsulant 25 and the second semiconductor elements 34 are partially removed to expose the second semiconductor elements 34 from the second encapsulant 25. Therefore, the exposed surfaces of the second semiconductor elements 34 are flush with the second encapsulant 25 and the second semiconductor elements 34 are thinned.

If the second semiconductor elements 34 are disposed on and electrically connected to the first semiconductor elements by wire bonding, since the overall thickness of the second semiconductor elements 34 already meets the thinning requirement, the flattening and thinning process can be dispensed with. As such, bonding wires can be prevented from being damaged by the flattening and thinning process.

Figure 3H:
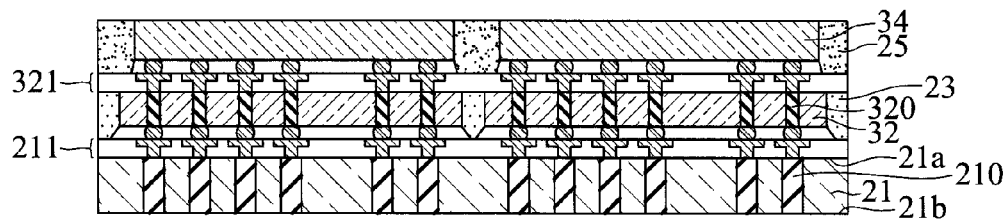

Referring to FIG. 3H, the interposer 21 is partially removed from the second side 21b thereof to expose the first conductive through holes 210. Therefore, the first conductive through holes 210 penetrate the first side 21a and the second side 21b of the interposer 21.

Figure 3I:
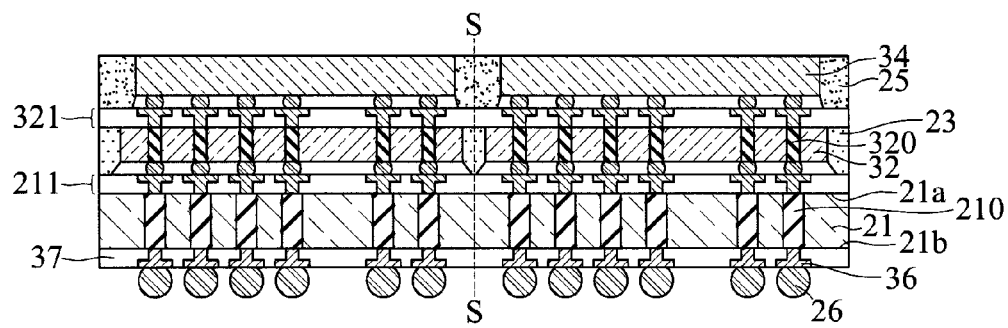

Referring to FIG. 3I, at least a dielectric layer 37 is formed on the second side 21b of the interposer 21 and at least a circuit layer 36 is formed on the dielectric layer 37 and electrically connected to the first conductive through holes 210. Further, a plurality of conductive elements 26 are formed on the outermost circuit layer 36.

Figure 3J:
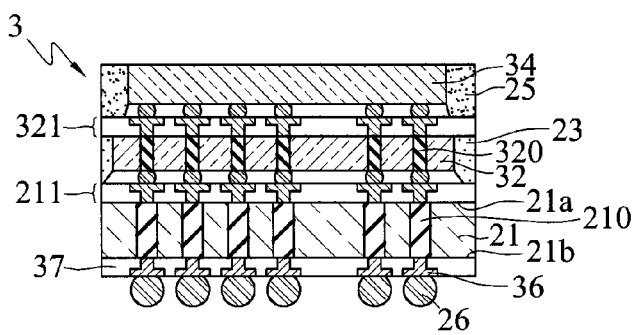

Referring to FIG. 3J, a singulation process is performed along a cutting path S of FIG. 3I.

Figure 3K:
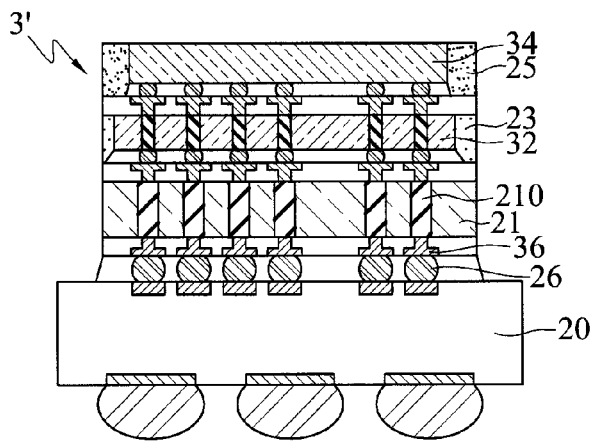

Referring to FIG. 3K, a packaging substrate 20 is disposed on the conductive elements 26 and electrically connected to the first conductive through holes 210 through the circuit layer 36.

Therefore, by stacking the first semiconductor elements 22, 32 and the second semiconductor elements 24, 34 on the interposer 21 first and then thinning the interposer 21, the present invention reduces the overall stack thickness of the semiconductor package without causing warpage of the interposer and allows a plurality of heterogeneous or homogeneous chips to be integrated in a semiconductor package. As such, the present invention simplifies the fabrication process, reduces the fabrication cost and time, and increases the productivity.

Further, the outermost semiconductor elements can be selectively exposed from the encapsulant and covered by a heat dissipating material.

The present invention provides a semiconductor package 2, 2', 3, 3', which has: an interposer 21; at least a first semiconductor element 22, 32 disposed on the interposer 21; a first encapsulant 23 formed on the interposer 21 for encapsulating the first semiconductor element 22, 32; at least a second semiconductor element 24, 34 disposed on the first semiconductor element 22, 32; and a second encapsulant 25 formed on the first semiconductor element 22, 32 and the first encapsulant 23 for encapsulating the second semiconductor element 24, 34.

The interposer 21 has opposite first and second sides 21a and a plurality of first conductive through holes 210 penetrating the first and second sides 21a, 21b. The interposer 21 is made of a silicon-containing substrate.

The first semiconductor element 22, 32 has opposite first and second surfaces 22a, 22b and is disposed on the first side 21a of the interposer 21 via the second surface 22b thereof. The first semiconductor element 22, 32 is a functional chip.

The first encapsulant 23 is formed on the first side 21a of the interposer 21 for encapsulating the first semiconductor element 22, 32. The first surface 22a of the first semiconductor element 22, 32 is exposed from the first encapsulant 23.

The second semiconductor element 24, 34 has opposite third and fourth surfaces 24a, 24b and is disposed on the first surface 22a of the first semiconductor element 22, 32 via the fourth surface 24b thereof.

The second encapsulant 25 is formed on the first surface of the first semiconductor element 22, 32 and the first encapsulant 23 for encapsulating the second element 24, 34.

Further, a first RDL structure 211 can be formed on the first side 21a of the interposer 21 for electrically connecting the first semiconductor element 22, 32 to the first conductive through holes 210.

The first semiconductor element 22, 32 can further have a plurality of second conductive through holes 220, 320 electrically connected to the first conductive through holes 210.

The first surface 22a of the first semiconductor element 22, 32 can be flush with the first encapsulant 23.

Further, a second RDL structure 321 can be formed on the first surface of the first semiconductor element 32 and electrically connected to the second semiconductor element 34.

The third surface 24a of the second semiconductor element 24, 34 can be exposed from the second encapsulant 25. The third surface 24a of the second semiconductor element 24, 34 can be flush with the second encapsulant 25.

The semiconductor package 2', 3' can further have a packaging substrate 20 disposed on the second side 21b of the interposer 21 and electrically connected to the interposer 21.

The semiconductor package 3, 3' can further have at least a circuit layer 36 formed on the second side 21b of the interposer 21 and electrically connected to the first conductive through holes 210.

Therefore, by stacking multi-layers of semiconductor elements on an interposer first and then thinning the interposer, the present invention effectively reduces the thickness of the semiconductor package and prevents warpage of the interposer.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   an interposer having opposite first and second sides and a plurality of first conductive through holes penetrating the first and second sides;
   at least a first semiconductor element having a first surface and a second surface opposite to the first surface, wherein the first semiconductor element is disposed on the first side of the interposer via the second surface thereof and electrically connected to the interposer;
   a first encapsulant formed on the first side of the interposer for encapsulating the first semiconductor element, wherein the first surface of the first semiconductor element is exposed from the first encapsulant, and the first encapsulant is flush with side edges of the interposer;
   at least a second semiconductor element having a third surface and a fourth surface opposite to the third surface, wherein the second semiconductor element is disposed on the first surface of the first semiconductor element via the fourth surface thereof and electrically connected to the first semiconductor element; and
   a second encapsulant formed on the first surface of the first semiconductor element and the first encapsulant for encapsulating the second semiconductor element, wherein the second encapsulant is flush with the side edges of the interposer.

2. The package of claim 1, wherein the interposer is a silicon-containing substrate.

3. The package of claim 1, further comprising an RDL (Redistribution Layer) structure formed on the first side of the interposer for electrically connecting the first semiconductor element and the first conductive through holes.

4. The package of claim 1, wherein the first semiconductor element is a functional chip.

5. The package of claim 1, further comprising a plurality of second conductive through holes formed in the first semiconductor element and electrically connected to the first conductive through holes.

6. The package of claim 1, further comprising an RDL structure formed on the first surface of the first semiconductor element and electrically connected to the second semiconductor element.

7. The package of claim 1, wherein the first surface of the first semiconductor element is flush with the first encapsulant.

8. The package of claim 1, wherein the third surface of the second semiconductor element is flush with the second encapsulant.

9. The package of claim 1, wherein the third surface of the second semiconductor element is exposed from the second encapsulant.

10. The package of claim 1, further comprising at least a circuit layer formed on the second side of the interposer and electrically connected to the first conductive through holes.

11. The package of claim 1, further comprising a packaging substrate disposed on the second side of the interposer and electrically connected to the interposer.

* * * * *